United States Patent [19]

Kashimura

[11] Patent Number: 4,953,133
[45] Date of Patent: Aug. 28, 1990

[54] DECODER BUFFER CIRCUIT INCORPORATED IN SEMICONDUCTOR MEMORY DEVICE

[75] Inventor: Masahiko Kashimura, Tokyo, Japan

[73] Assignee: NEC Corporation, Tokyo, Japan

[21] Appl. No.: 313,202

[22] Filed: Feb. 21, 1989

[30] Foreign Application Priority Data

Feb. 19, 1988 [JP] Japan .................................. 63-36850

[51] Int. Cl.$^5$ ................................................ G11C 7/00
[52] U.S. Cl. ............................ 365/230.06; 365/230.08
[58] Field of Search ....................... 365/230.06, 230.08, 365/189.05; 365/230.06, 230.08, 189.05, 191, 193; 307/269

[56] References Cited

U.S. PATENT DOCUMENTS 4,085,460 4/1978 Lodi ................................. 365/230.06

Primary Examiner—Joseph A. Popek
Attorney, Agent, or Firm—Sughrue, Mion, Zinn, Macpeak & Seas

[57] ABSTRACT

For decreasing the number of component transistors, a decoder buffer circuit has a first gate transistor activated on the selection of the two word lines associated thereto for an establishment of a current path, first and second complementary inverter circuits operative to complementarily activate one of the two word lines with a current fed from the current path depending upon the leaest significant bit of a row address signal, and a second gate transistor operative to isolate the two word lines from each other during the operation of the first and second complementary inverter circuits and to ground the two word lines outside the operation, so that the decoder buffer circuit is formed by only six component transistors for complementary activation of the two word lines.

5 Claims, 4 Drawing Sheets

PRIOR-ART

PRIOR-ART

DECODER BUFFER CIRCUIT INCORPORATED IN SEMICONDUCTOR MEMORY DEVICE

FIELD OF THE INVENTION

This invention relates to a semiconductor memory device and, more particularly, to a decoder buffer circuit provided in association with an address decoder circuit.

BACKGROUND OF THE INVENTION

A typical example of the decoder buffer circuit is illustrated in FIG. 1 of the drawings. The prior-art decoder buffer circuit 1 is provided in association with an address decoder circuit 2 and selectively activates one of the word lines W0 and W1. The address decoder circuit 2 has a plurality of n+1 input NAND gates 3 to 4, and address bits A0 to An of an n+1 bit address signal and the complementary bits $\overline{A0}$ to $\overline{An}$ thereof are supplied to the NAND gates 3 to 4. With the address bits and the complementary address bits, one of the NAND gates 3 to 4 shifts the output node thereof from the inactive high voltage level to the active low voltage level. The decoder buffer circuit 1 is formed by a plurality of two input NOR gates 5 to 6 respectively paired with the NAND gates 3 to 4, and one of the two input nodes of each NOR gate is coupled to the output node of the corresponding NAND gate 3 or 4. The other input nodes of the NOR gates 5 to 6 are commonly coupled to a strobe signal line 7, so that the NOR gates 5 to 6 are activated in the presence of the strobe signal ST of the active low voltage level. The decoder buffer circuit 1 thus arranged allows one of the word lines to go up to the active high voltage level when the active low voltage level is supplied from one of the NAND gate 3 or 4 to the NOR gate 7 or 8 paired therewith. However, when the strobe signal ST is recovered to the inactive high voltage level, all of the NOR gates 5 to 7 remains in the inactive low voltage level.

Each of the NOR gates 5 and 6 are formed by a series combination of two p-channel type field effect transistors 8 and 9 coupled between a positive voltage line and an output node 11 and two n-channel type field effect transistors 12 and 13 coupled in parallel between the output node 11 and a ground node 14. The output node of each NAND gate 3 or 4 is coupled to the gate electrodes of the two field effect transistors 8 and 12, and the strobe signal line 7 is coupled to the gate electrodes of the field effect transistors 9 and 13. The word line W0 or W1 is coupled to the output node 11, so that no conduction path takes place between the positive voltage line 10 and the output node 11 in the absence of the strobe signal of the active low voltage level due to the p-channel type field effect transistor 9 in the off state. However, when the strobe signal goes up to the low voltage level, the voltage level at the output node 11 depends on the complementary functions of the field effect transistors 8 and 12 and, accordingly, the output node 11 is complementarily shifted between the high voltage level and the low voltage level with respect to the output node of the NAND gate 3 or 4.

However, a problem is encountered in the prior-art decoder buffer circuit in that a large number of component transistors are consumed to form the decoder buffer circuit 1 associated with the decoder circuit 2. Each two input NOR gate is formed by four field effect transistors as illustrated in FIG. 2, and each n+1 input NAND gate needs 2(n+1) field effect transistors. In order to control every word line, it is necessary to provide a series combination of the n+1 input NAND gate and the two input NOR gate, and, for this reason, the total number TR of the field effect transistors associated with every word line is calculated as:

$$TR = 2(n+1) + 4 = 2n + 6$$

This results in that a large area on a semiconductor chip is consumed by the peripheral circuits for activation of the word lines. Moreover, a large amount of current is consumed for controlling the word lines.

SUMMARY OF THE INVENTION

It is therefore an important object of the present invention to provide a decoder buffer circuit which is formed by a relatively small number of the component transistors.

In accordance with the present invention, there is provided a decoder buffer circuit associated with a decoder circuit incorporated in a semiconductor memory device for activation of one of two word lines, comprising: (a) a first gate transistor coupled between a first source of constant voltage level and a node and gated by the decoder circuit; (b) a first complementary inverter circuit responsive to one of two control signals complementarily shifted between an active voltage level and an inactive voltage level and coupled between the node and a second source of constant voltage level different in voltage level from the first source of constant voltage level, an output node of the first complementary inverter circuit being coupled to one of the two word lines; (c) a second complementary inverter circuit responsive to the other of the two control signals and coupled between the node and the second source of constant voltage level, an output node of the second complementary inverter circuit being coupled to the other of the two word lines; and (d) a second gate transistor coupled between the output nodes of the first and second complementary inverter circuits and complementarily shifted by the decoder circuit with respect to the first gate transistor.

BRIEF DESCRIPTION OF THE DRAWINGS

The features and advantages of a decoder buffer circuit according to the present invention will be more clearly understood from the following description taken in conjunction with the accompanying drawings in which.

DESCRIPTION OF THE PREFERRED EMBODIMENT

Figure 1:
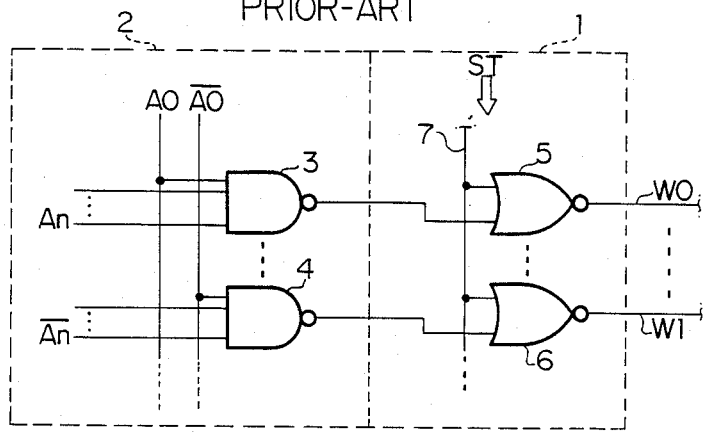
FIG. 1 is a logic diagram showing the arrangement of a prior-art decoder buffer circuit.
Figure 2:
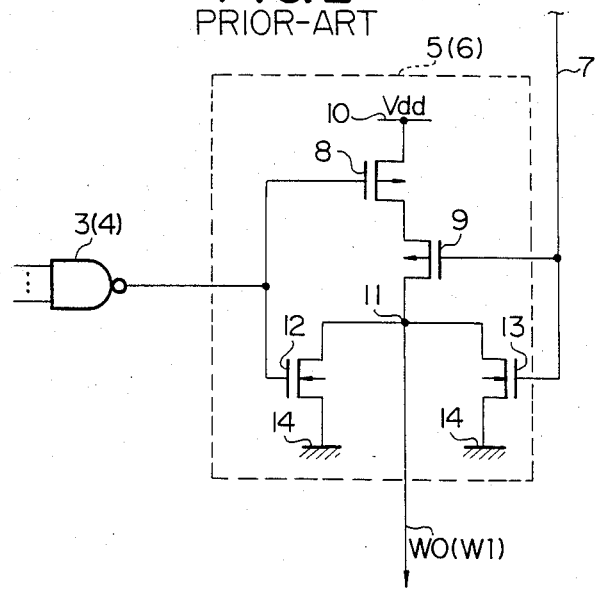
FIG. 2 is a circuit diagram showing the arrangement of a NOR gate used for fabricating the decoder buffer circuit.
Figure 3:
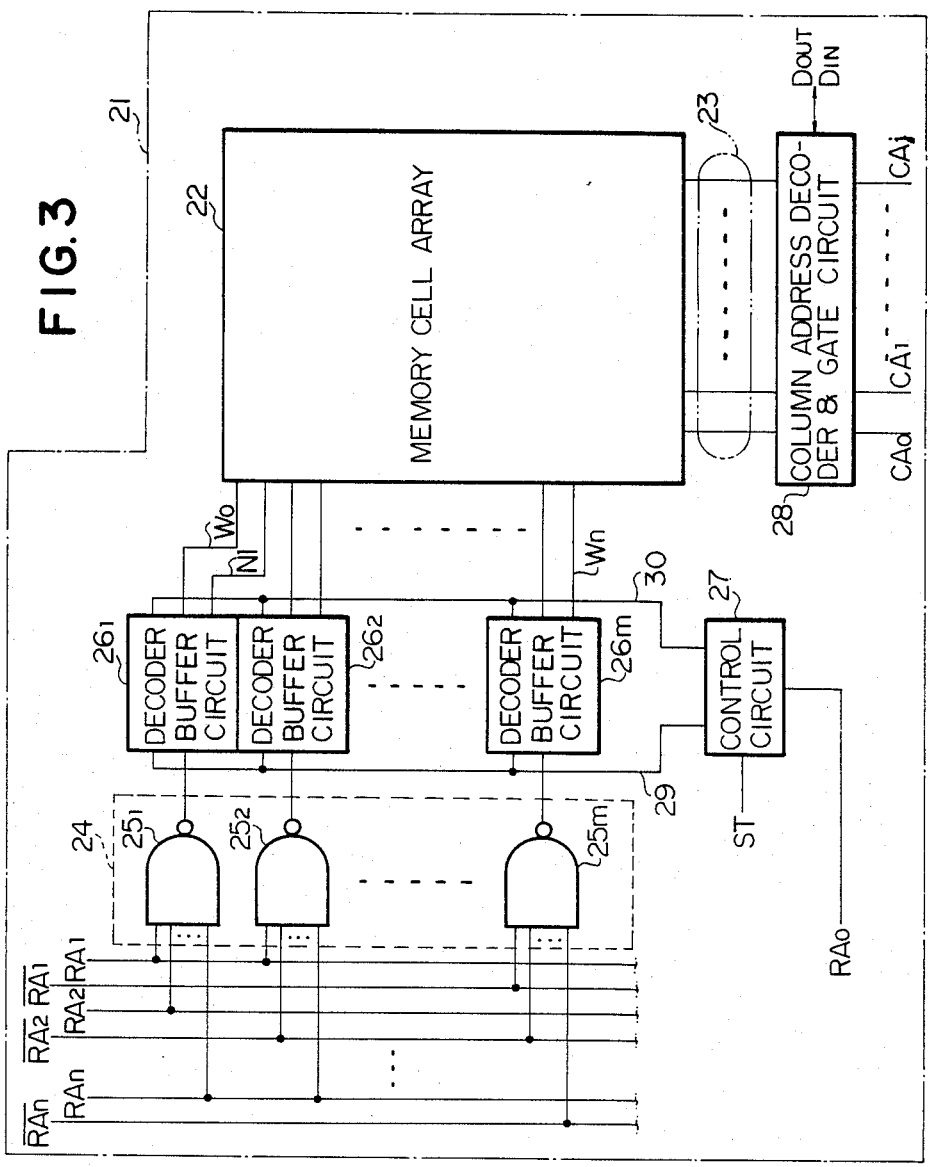
FIG. 3 is a block diagram showing the arrangement of a semiconductor memory device provided with a plurality of decoder buffer circuits according to the present invention.

Referring first to FIG. 3 of the drawings, there is shown an essential part of a semiconductor memory device fabricated on a single semiconductor chip 21 and comprises a memory cell array 22 accompanied with plural pairs of data lines 23 and a plurality of word lines W0 to Wn, a row decoder circuit 24 responsive to an row address bits RA1 to RAn of a row address signal and the complementary bits $\overline{RA1}$ to $\overline{RAn}$ and provided with a plurality of NAND gates $25_1$ to $25_m$, a plurality of decoder buffer circuits $26_1$ to $26_m$ respectively coupled to the NAND gates $25_1$ to $25_m$, a control circuit 27 responsive to a strobe signal ST and the least significant bit RAO of the row address signal and coupled to all of the decoder buffer circuits $26_1$ to $26_m$, and a combined column address decoder circuit and gate circuit 28 responsive to column address bits CAO to CAj of a column address signal for providing conduction path between the a pair of data lines 23 and an output buffer circuit (not shown) to produce output data Dout or to receive input data Din. The row address decoder circuit 24 is similar in arrangement to that of the prior art illustrated in FIG. 1 except for the number of the row address bits supplied thereto. The word lines are grouped by two, and the two word lines of each group are coupled to each decoder buffer circuit. The control circuit 27 has two control lines 29 and 30 coupled in parallel to all of the decoder buffer circuits $26_1$ to $26_m$. When the strobe signal ST is at an inactive high voltage level, the two control lines 29 and 30 are complementarily shifted between an active low voltage level and an inactive high voltage level depending upon the least significant bit RAO of the row address signal for activation of one of the two word lines. On the other hand, when the strobe signal ST is at an active low voltage level, the control lines 29 and 30 are changed to the inactive high voltage level irrespective of the least significant bit RAO The strobe signal ST takes the active low voltage level, when any one of the row address bits RAO to RAn changes. In other words, the row address signal is allowed to change only when the strobe signal ST is at the low voltage level. The present invention appertains to the decoder buffer circuits $26_1$ to $26_m$, and the decoder buffer circuits $26_1$ to $26_m$ are similar in circuit arrangement to one another, so that description is hereinunder focused upon the decoder buffer circuit $26_1$ only.

Figure 4:
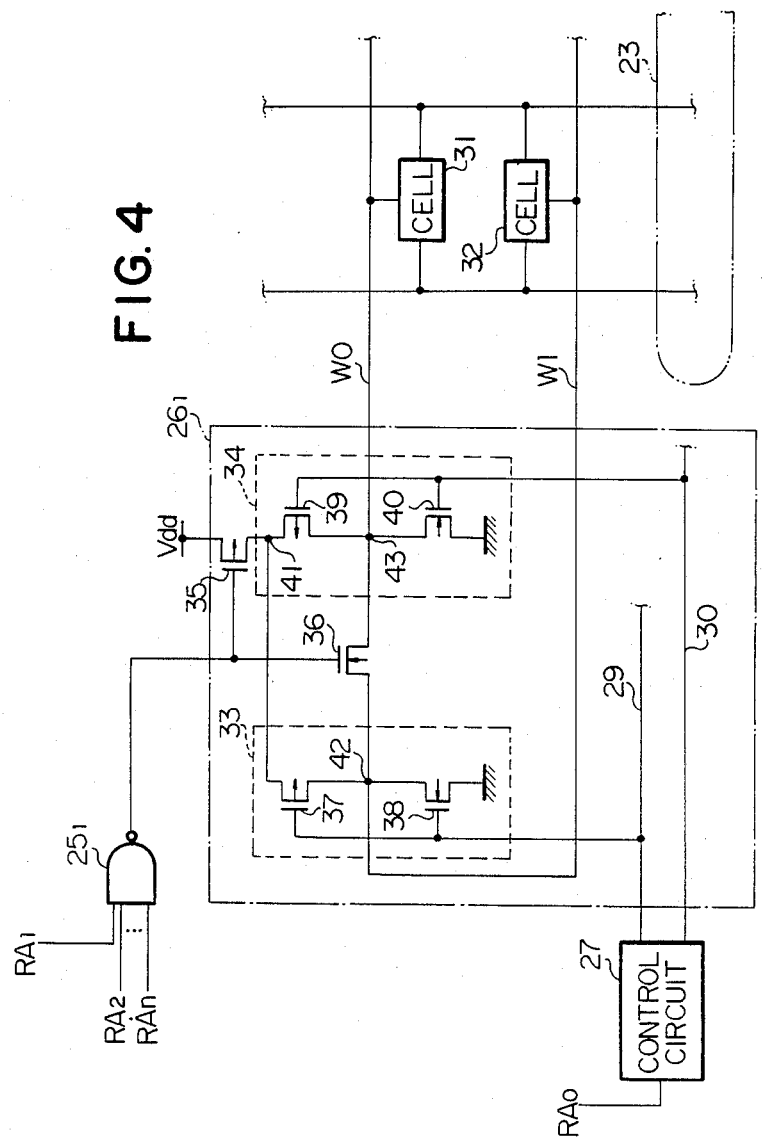
FIG. 4 is a circuit diagram showing the arrangement of a decoder buffer circuit embodying the present invention.

Turning to FIG. 4 of the drawings, the arrangement of the decoder circuit $26_1$ is illustrated in detail together with the related component circuits such as the NAND gate $25_1$, the control circuit 27, and two memory cells 31 and 32 forming part of the memory cell array 22 The decoder buffer circuit $26_1$ comprises first and second complementary inverter circuits 33 and 34 and two gate transistors 35 and 36. The first complementary inverter circuit 33 has a series combination of a p-channel type field effect transistor 37 and an n-channel type field effect transistor 38, and the second complementary inverter circuit 34 is formed by a p-channel type field effect transistor 39 and an n-channel type field effect transistor 40 coupled in series. The gate transistor 35 is of the p-channel type, however, the gate transistor 36 is of the n-channel type. The gate transistor 35 is capable of a conduction path between a source of positive voltage level Vdd and a node 41, and the first and second complementary inverter circuits 33 and 34 are coupled in parallel between the node 41 and a ground node. The first complementary inverter circuit 33 is dedicated to the word line W1, and the second complementary inverter circuit 34 is provided for the word line W0, so that output nodes 42 and 43 of the first and second complementary inverter circuits 33 and 34 are respectively coupled to the word lines W1 and W0, respectively. The gate transistor 36 is coupled between the output nodes 42 and 43, and the gate electrodes of the gate transistors 35 and 36 are coupled to the NAND gate $25_1$.

Figure 7:
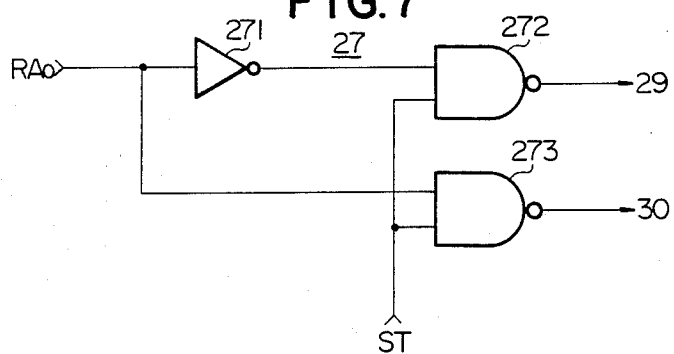
FIG. 7 is a circuit diagram showing the arrangement of a control circuit shown in FIG. 3.

Turning to FIG. 7 of the drawings, the control circuit 27 comprises an inverter circuit 271 and two NAND gates 272 and 273. The least significant bit RAO of the row address signal is supplied through the inverter circuit 271 to one of the input nodes of the NAND gate 272 and directly to one of the input nodes of the NAND gate 273. The strobe signal ST is commonly supplied to the other input nodes of the NAND gates 272 and 273. The control lines 29 and 30 are respectively coupled to the output nodes of the NAND gates 272 and 273.

When the strobe signal ST remains in the low voltage level for allowing the row address signal to change, the output nodes of the NAND gates 272 and 273 and, accordingly, the control lines 29 and 30 are shifted to the high voltage lev 1. With the control lines 29 and 30 shifted to the high voltage level, the transistors 38 and 40 of each buffer circuit 26 turn on to shift all of the word lines W0 to Wn into the low voltage level. This results in that a plurality of word lines are surely prevented from being concurrently shifted into the high voltage level upon a variation of the row address signal. When the strobe signal ST is shifted to the high voltage level, both of the NAND gates 272 and 273 are activated, and, accordingly, one of the control lines 29 and 30 is shifted to the high voltage level but the other remains in the low voltage level depending upon the least significant bit RAO.

Figure 5:
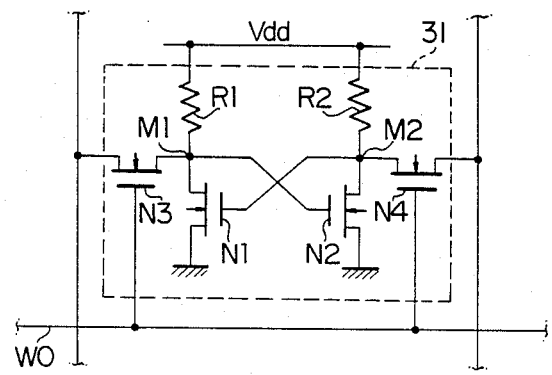
FIG. 5 is a circuit diagram showing the arrangement of each memory cell of a memory cell array illustrated in FIG. 3.
Figure 6:
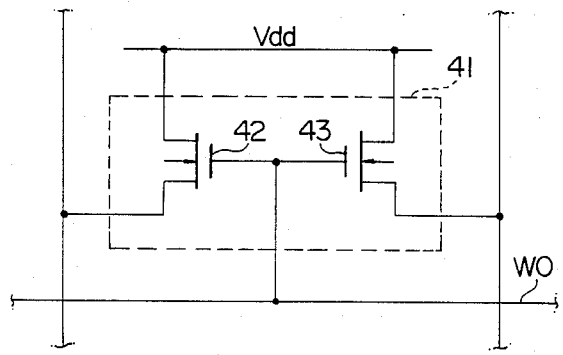
FIG. 6 is a circuit diagram showing the arrangement of another memory cell replacable with the memory cell illustrated in FIG. 5.

In this instance, each of the memory cells including the memory cells 31 and 32 is of a static random access type with six element illustrated in FIG. 5. Namely, each memory cell has two series combinations of resistors R1 and R2 and n-channel type field effect transistors N1 and N2 coupled in parallel between the source of positive voltage level Vdd and the ground, and two n-channel type gate transistors N3 and N4 coupled between the data line pair and two memory nodes M1 and M2, respectively, and the gate electrodes of the n-channel type field effect transistors N2 and N1 are respectively coupled to the memory nodes M1 and M2 in a cross-coupled manner. However, each of the memory cells of the memory cell array 22 is replacable with a memory cell 41 illustrated in FIG. 6, and the memory cell 41 is of the read only memory. The memory cell 41 has two n-channel type field effect transistors 42 and 43 coupled between the source of positive voltage Vdd and the word line W0. However, one of the n-channel type field effect transistors is increased in thickness of the gate insulating film for isolating the data line coupled thereto from the source of positive voltage level Vdd, so that only one conduction path is provided between the source of the positive voltage level Vdd and the data line depending upon the data bit stored in the memory cell 41.

Description is made for the circuit behavior with reference to FIGS. 5 and 7. All of the word lines W1 to Wn are shifted to the low voltage level with the strobe signal ST supplied before a variation of the row address signal. While the strobe signal ST remains in the low voltage level, the word lines W1 to Wn are kept in the low voltage level, and a new address is established in the row address decoder circuit 24. If the new row address has a bit string consisting of row address bits RA1 to RAn of "1", the NAND gate 251 produces the active low voltage level. For this reason, the first gate transistor 35 turns on to provide the conduction path between the source of positive voltage level Vdd and the node 41, however, the second gate transistor 36 is turned off to isolate the word line W0 from the word line W1. However, the strobe signal ST still remains in the low voltage level, so that all of the word lines W0 to Wn are kept in the low voltage level. When the strobe signal ST is shifted to the high voltage level, the control circuit 27 allows the control lines 29 and 30 to complementarily shift in the voltage level depending upon the least significant bit RA0. If the least significant bit RA0 specifies the word line W0, the control circuit 27 shifts the control line 30 to the active low voltage level, so that the node 41 is coupled to the output node 43 through the p-channel type field effect transistor 39, however, the output node 42 is isolated from the node 41 with the inactive high voltage level on the control line 29. Then, the word line W0 goes up to the active high voltage level, but the word line W1 remains in the inactive low voltage level.

On the other hand, when the least significant bit A0 specifies the word line W1, the control circuit 27 shifts the control line 29 to the active low voltage level, so that the node 41 is coupled to the output node 42 through the p-channel type field effect transistor 37, however, the output node 43 is isolated from the node 41 with the inactive high voltage level on the control line 30. Then, the word line W1 goes up to the active high voltage level, but the word line W0 remains in the inactive low voltage level. Thus, one of the word lines is activated to the active high voltage level, the memory cells coupled to the activated word line are coupled to the data lines pairs, respectively, thereby being accessible from the outside of the semiconductor memory device.

As will be understood from the foregoing description, the decoder buffer circuit according to the present invention is formed by the six component transistors for controlling the two word lines, so that only three component transistors are related to control each of the word lines. Then, the present invention is advantageous over the prior art decoder buffer circuit in the number of the component transistor, and, accordingly, the peripheral circuit merely occupies a relatively small area on the semiconductor chip.

Although particular embodiments of the present invention have been shown and described, it will be obvious to those skilled in the art that various changes and modifications may be made without departing from the spirit and scope of the present invention

What is claimed is:

1. A decoder buffer circuit associated with a decoder circuit incorporated in a semiconductor memory device for activation of one of two word lines, comprising:
   (a) a first gate transistor coupled between a first source of constant voltage level and a node and gated by said decoder circuit;
   (b) a first complementary inverter circuit responsive to one of two control signals complementarily shifted between an active voltage level and an inactive voltage level and coupled between said node and a second source of constant voltage level different in voltage level from said first source of constant voltage level, an output node of said first complementary inverter circuit being coupled to one of said two word lines;
   (c) a second complementary inverter circuit responsive to the other of said two control signals and coupled between said node and said second source of constant voltage level, an output node of said second complementary inverter circuit being coupled to the other of said two word lines; and
   (d) a second gate transistor coupled between the output nodes of said first and second complementary inverter circuits and complementarily shifted by said decoder circuit with respect to said first gate transistor.

2. A decoder buffer circuit as set forth in claim 1, in which said first and second sources of constant voltage has a positive voltage level and a the ground voltage level, respectively, and in which each of said first and second complementary inverter circuits is formed by a series combination of a p-channel type field effect transistor and an n-channel type field effect transistor coupled between said node and said second source of constant voltage level.

3. A decoder buffer circuit as set forth in claim 2, in which said first and second gate transistors are formed by a p-channel type field effect transistor and an n-channel type field effect transistor, respectively.

4. A decoder buffer circuit as set forth in claim 1, in which said two control signals are supplied from a control circuit incorporated in said semiconductor memory device and in which said control circuit is responsive to the least significant bit of an address signal.

5. A decoder buffer unit associated with a decoder circuit incorporated in a semiconductor memory device having a plurality of word lines, said decoder buffer unit being provided for activation of one of said word lines, said decoder buffer unit having a plurality of decoder buffer circuits each associated with two of said word lines and comprising:
   (a) a first gate transistor coupled between a first source of constant voltage level and a node and gated by said decoder circuit;
   (b) a first complementary inverter circuit responsive to one of two control signals complementarily shifted between an active voltage level and an inactive voltage level and coupled between said node and a second source of constant voltage level different in voltage level from said first source of constant voltage level, an output node of said first complementary inverter circuit being coupled to one of said two word lines;
   (c) a second complementary inverter circuit responsive to the other of said two control signals and coupled between said node and said second source of constant voltage level, an output node of said second complementary inverter circuits being coupled to the other of said two word lines; and
   (d) a second gate transistor coupled between the output nodes of said first and second complementary inverter circuits and complementarily shifted by said decoder circuit with respect to said first gate transistor.

* * * * *

UNITED STATES PATENT AND TRADEMARK OFFICE
CERTIFICATE OF CORRECTION

PATENT NO.  : 4,953,133
DATED       : August 28, 1990
INVENTOR(S) : Masahiko KASHIMURA It is certified that error appears in the above-identified patent and that said Letters Patent is hereby corrected as shown below:

Abstract, line 8, delete "leaest" and insert --least--.

Col. 4, line 28, delete "lev 1." and insert --level--.

Col. 5, line 8, delete "251" and insert --$25_1$--.

Signed and Sealed this

Thirty-first Day of December, 1991

Attest:

HARRY F. MANBECK, JR.

*Attesting Officer*    Commissioner of Patents and Trademarks